United States Patent
Horiuchi et al.

(10) Patent No.: US 8,204,700 B2
(45) Date of Patent: Jun. 19, 2012

(54) FAILURE PREDICTION APPARATUS AND FAILURE PREDICTION METHOD

(75) Inventors: Akihiro Horiuchi, Fukuoka (JP);
Satsuki Norimatsu, Fukuoka (JP);
Akira Yamamoto, Fukuoka (JP);
Yuichiro Sakane, Fukuoka (JP)

(73) Assignee: Fujitsu Limited, Kawasaki (JP)

( * ) Notice: Subject to any disclaimer, the term of this patent is extended or adjusted under 35 U.S.C. 154(b) by 682 days.

(21) Appl. No.: 12/327,333

(22) Filed: Dec. 3, 2008

(65) Prior Publication Data
US 2009/0192735 A1 Jul. 30, 2009

(30) Foreign Application Priority Data
Jan. 29, 2008 (JP) .................. 2008-018166

(51) Int. Cl.
*G01R 31/00* (2006.01)
(52) U.S. Cl. .......................................... 702/58
(58) Field of Classification Search .............. 702/58; 369/53.26; 375/228; 398/9; 359/110
See application file for complete search history.

(56) References Cited

U.S. PATENT DOCUMENTS
2002/0024691 A1* 2/2002 Kajita ........................ 359/110
2005/0030868 A1* 2/2005 Kamon et al. ............. 369/53.26
2008/0253437 A1* 10/2008 Kim et al. ..................... 375/228

FOREIGN PATENT DOCUMENTS
| JP | 58-075336 | 5/1983 |
| JP | 07-55868 | 3/1995 |
| JP | 09-116231 | 5/1997 |
| JP | 2003-008136 | 1/2003 |

OTHER PUBLICATIONS

Japanese Office Action issued Dec. 20, 2011 in corresponding Japanese Patent Application No. 2008-018166.

* cited by examiner

*Primary Examiner* — Drew A Dunn
*Assistant Examiner* — Xiuquin Sun
(74) *Attorney, Agent, or Firm* — Staas & Halsey LLP

(57) ABSTRACT

An optical pickup which has a failure prediction apparatus for predicting a failure of a laser diode has an input inputting a value of a current that flows through the laser diode and is measured at predetermined time intervals, a storage storing the current values inputted by said input, a detector detecting a current value that is a current value at any one of the measurement times of day stored in said storage and that has a change greater than or equal to a predetermined value relative to the current value at the preceding measurement time of day, and a generator generating a prediction curve that indicates a relationship between said elapsed time and the current value applicable at and after the measurement time of day of the current value detected by said detector.

4 Claims, 12 Drawing Sheets

FIG.4

SPECIFYING INFORMATION

LASER DIODE IDENTIFICATION NUMBER
COMPONENT TYPE
OPERATION START DATE

ACTUAL MEASUREMENT INFORMATION

DATE AND TIME OF MEASUREMENT
TEMPERATURE
CURRENT VALUE
OUTPUT OPTICAL POWER

FAILURE PREDICTION APPARATUS AND FAILURE PREDICTION METHOD

CROSS-REFERENCE TO RELATED APPLICATIONS

This application is based upon and claims the benefit of priority of the related Japanese Application No. 2008-18166, filed on Jan. 29, 2008, the entire contents of which are incorporated herein by reference.

BACKGROUND OF THE INVENTION

1. Field of the Invention

The present invention relates to a failure prediction apparatus and a failure prediction method for performing failure prediction for a laser diode employed in an optical transmission apparatus.

2. Description of the Related Art

In a related art optical transmission apparatus, an optical signal is amplified with laser light generated by oscillation in a laser diode, and the optical level of the optical signal is kept constant. The optical level of the optical signal is always monitored in the optical transmission apparatus. Then, if the optical level is not constant, the value of the current that flows through the laser diode is adjusted so that the optical level is kept constant.

In general, the value of a current necessary to maintain a constant optical level of the optical signal varies depending on the environment around the laser diode, its degradation, and the like. A change in the current value is successively outputted on a monitor in such an optical transmission apparatus. A maintenance person predicts a time point for changing the laser diode or a time point for switching to a reserve system on the basis of comparison between an empirically determined threshold value for the current and the value of the current that flows through the laser diode.

Further, a technique is disclosed in which a child station in an optical transmission apparatus detects a change in the current flowing through a laser diode. The child station then modulates the change component of the current as a part of an optical signal, and transmits the signal to a parent station in the optical transmission apparatus. The parent station monitors degradation and the like in the laser diode (see Japanese Laid-Open Patent Publication No. 58-75336).

Further, a technique is disclosed in which a maintenance person can check equipment at a field site where the equipment is installed using an equipment diagnosis system, even though the equipment is off line. In this technique, the life expectancy of equipment is predicted on the basis of acquired inspection data and a relational formula for estimating the life expectancy of the equipment (see Japanese Laid-Open Patent Publication No. H7-55868).

Nevertheless, the related art optical transmission apparatus has a problem in that a failure time point due to degradation in the laser diode cannot be predicted automatically and accurately. That is, since a maintenance person predicts a failure time point of the laser diode on the basis of a comparison between an empirically determined threshold value for the current and the value of the current that flows through the laser diode, a failure time point of the laser diode in the optical transmission apparatus cannot be predicted automatically if the specification of the failure time point does not have sufficient accuracy.

Further, normal optical transmission cannot be performed in the optical transmission apparatus when degradation in the laser diode progresses more rapidly than expected for any reason. When degradation in the laser diode progresses more rapidly than expected, a failure occurs in the laser diode at a time point earlier than a failure time point empirically predicted by a maintenance person. This causes a serious problem to society.

Further, according to the technique disclosed in Japanese Laid-Open Patent Publication No. S58-75336 described above, the parent station in the optical transmission apparatus can monitor a change in the current that flows through the laser diode, but cannot automatically predict a failure time point of the laser diode.

Further, according to the technique disclosed in Japanese Laid-Open Patent Publication No. H7-55868 described above, the equipment diagnosis system can predict the life expectancy of the equipment. Nevertheless, this prediction of the life expectancy is performed merely in order to obtain an in-the-field temporary diagnosis concerning the availability of operation and the like, and hence an accurate life expectancy cannot be estimated.

SUMMARY OF THE INVENTION

According to an aspect of an embodiment, an apparatus comprises an input for inputting a value of a current that flows through the laser diode and is measured at predetermined time intervals, storage for storing each of the current values inputted by the input in a paired manner with a measurement time of day, a detector for detecting a current value that is a current value at any one of the measurement times of day stored in the storage and that has a change greater than or equal to a predetermined value relative to the current value at the preceding measurement time of day, and a generator for generating a prediction curve that indicates a relationship between the elapsed time and the current value applicable at and after the measurement time of day of the current value detected by the detector on the basis of the current value detected by the detector and change information concerning a current value corresponding to an elapsed time from beginning of usage of the laser diode.

The present invention has been devised in view of the above-mentioned situations. An object of the present invention is to provide a failure prediction apparatus, a failure prediction method, and a failure prediction program for automatically and accurately performing failure prediction for a laser diode employed in an optical transmission apparatus.

In order to resolve the above-mentioned problems and achieve the above-mentioned object, the failure prediction apparatus predicts a failure of a laser diode and includes an input for inputting a value of a current that flows through the laser diode and is measured at predetermined time intervals; a storage for storing each of the current values inputted by the input in a paired manner with a measurement time of day; a detector for detecting a current value that is a current value at any one of the measurement times of day stored in the storage and that has a change greater than or equal to a predetermined value relative to the current value at the preceding measurement time of day; and a generator for generating a prediction curve that indicates a relationship between the elapsed time and the current value applicable at and after the measurement time of day of the current value detected by the detector on the basis of the current value detected by the detector and change information concerning a current value corresponding to an elapsed time from beginning of usage of the laser diode.

Additional objects and advantages of the embodiment will be set forth in part in the description which follows, and in part will be obvious from the description, or may be learned by practice of the invention.

The object and advantages of the invention will be realized and attained by of the elements and combinations particularly pointed out in the appended claims. It is to be understood that both the foregoing general description and the following detailed description are exemplary and explanatory only and are not restrictive of the invention, as claimed.

The above-described embodiments of the present invention are intended as examples, and all embodiments of the present invention are not limited to including the features described above.

BRIEF DESCRIPTION OF THE DRAWINGS

FIG. 4 is a diagram showing an example of data structure in an actual measurement information storage section according to an embodiment.

DETAILED DESCRIPTION OF THE PREFERRED EMBODIMENTS

Figure 1:
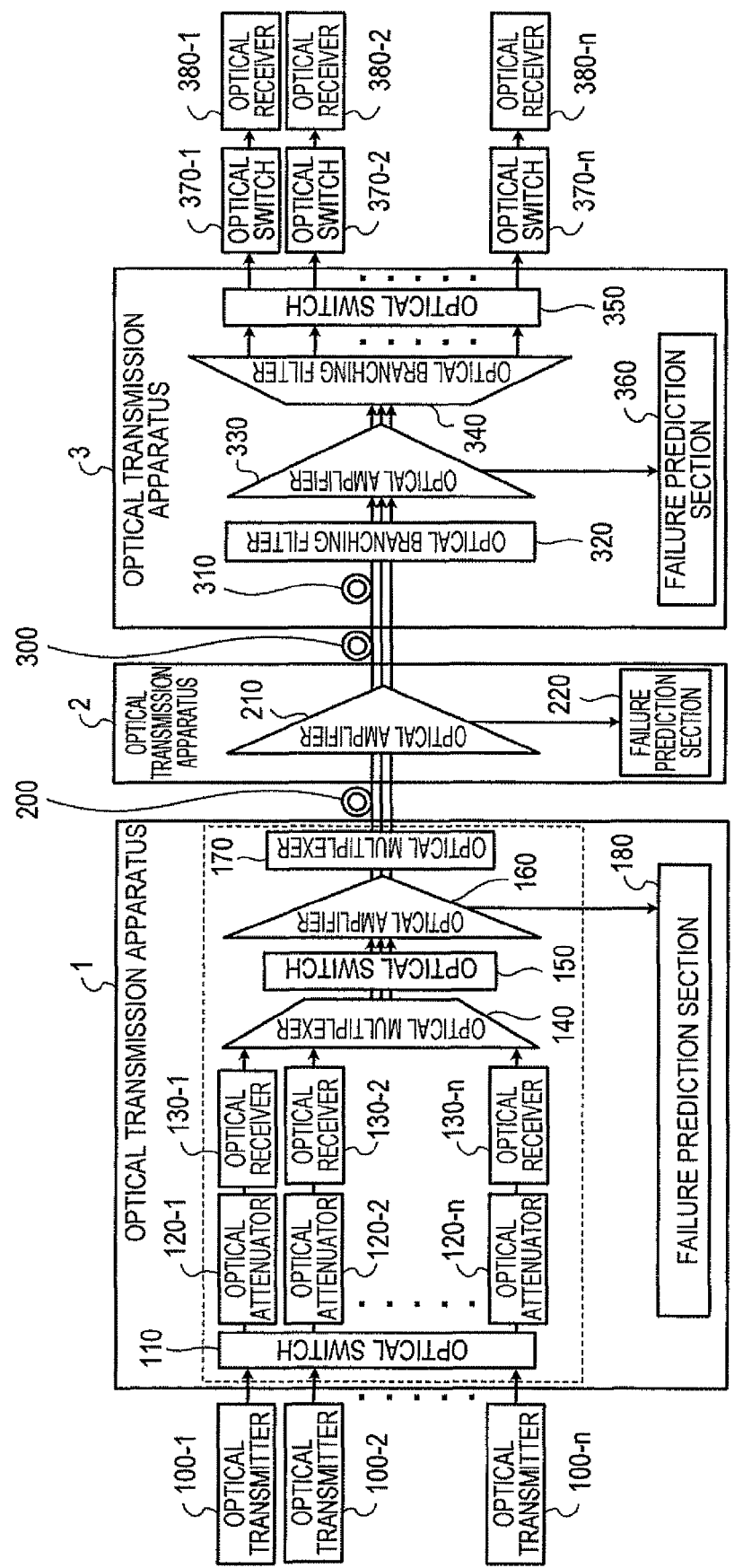
FIG. 1 is a diagram showing an example of an overall configuration of an optical transmission system according to an embodiment.

Reference may now be made in detail to embodiments of the present invention, examples of which are illustrated in the accompanying drawings, wherein like reference numerals refer to like elements throughout.

The present failure prediction apparatus is a failure prediction apparatus for predicting a failure of a laser diode, including an input for inputting a value of a current that flows through the laser diode and is measured at predetermined time intervals; a storage for storing each of the current values inputted by the input in a paired manner with a measurement time of day; a detector for detecting a current value that is a current value at any one of the measurement times of day stored in the storage and that has a change greater than or equal to a predetermined value relative to the current value at the preceding measurement time of day; and a generator for generating a prediction curve that indicates a relationship between the elapsed time and the current value applicable at and after the measurement time of day of the current value detected by the detector on the basis of the current value detected by the detector and change information concerning a current value corresponding to an elapsed time from beginning of usage of the laser diode.

According to this configuration, the failure prediction apparatus generates a prediction curve that indicates a relationship between the elapsed time from the beginning of usage of the laser diode and the current value applicable at and after the time of day when the measured current value has a change greater than or equal to the predetermined value relative to the current value at the preceding measurement time of day. Accordingly, current prediction can be performed automatically until the value of the current that flows through the laser diode reaches an overcurrent limit value that indicates the limit value of a current that the laser diode can bear. This permits prediction of a failure time point of the laser diode.

In the above-mentioned configuration, a failure prediction apparatus is characterized in that the generator generates a prediction curve on the basis of the current value detected by the detector; and characteristics information that is characteristics information defined in advance on the basis of component characteristics of the laser diode and that indicates a change in the current value corresponding to the elapsed time until a failure of the laser diode.

According to this configuration, the failure prediction apparatus generates a prediction curve that indicates the relationship between the elapsed time and the current value on the basis of the characteristics information defined in advance. Accordingly, even when a current value having a change greater than or equal to a predetermined value relative to the current value at the preceding measurement time of day is detected for the first time, a failure time point of the laser diode can be predicted accurately without the necessity of actual measurement information.

In the above-mentioned configuration, a failure prediction apparatus is characterized in that the generator includes a difference information storage for storing difference information composed of a difference between the current value detected by the detector and the current value at the preceding measurement time of day paired with the elapsed time until the measurement time of day of the current value detected by the detector; a curve judge for judging whether a difference between the current value detected by the detector and a current value corresponding to the measurement time of day of the current value on an already generated prediction curve is greater than or equal to a predetermined value; a number-of-information-pieces judge for judging whether the number of difference information pieces stored in the difference information storage is greater than or equal to a predetermined value when the curve judge judges that the difference is greater than or equal to the predetermined value; and a prediction curve corrector for correcting the prediction curve on the basis of the difference information in the difference information storage when the number-of-information-pieces judge judges that the number of difference information pieces is greater than or equal to the predetermined number, and correcting the prediction curve on the basis of the characteristics information when the number-of-information-pieces judge judges that the number of difference information pieces is smaller than the predetermined number.

According to this configuration, when the current value having a change greater than or equal to the predetermined value relative to the current value at the preceding measurement time of day is not present on the already generated prediction curve, the failure prediction apparatus corrects the prediction curve, thereby generating a prediction curve corresponding to the current value that changes in association with the present environment around the laser diode and with degradation, and thereby accurately predicting a failure time point of the laser diode. Further, the failure prediction apparatus stores difference information between a current value having a change greater than or equal to a predetermined value relative to the current value at the preceding measurement time of day and the current value at the preceding measurement time of day. Then, when the number of difference information pieces is greater than or equal to a predetermined number, the failure prediction apparatus corrects the prediction curve on the basis of the difference information, thereby can corrects the prediction curve on the basis of the actual measurement, and thereby can more accurately predict a failure time point of the laser diode.

In the above-mentioned configuration, a failure prediction apparatus is characterized in that when the elapsed time until the measurement time of day of the current value detected by the detector is shorter than the time indicated in the characteristics information in correspondence to the current value, the generator generates a prediction curve on the basis of the characteristics information and the elapsed time.

According to this configuration, with taking into consideration the elapsed time corresponding to the current value having a change greater than or equal to the predetermined value relative to the current value at the preceding measurement time of day, the failure prediction apparatus generates a prediction curve, thereby generating a prediction curve corresponding to the current value that changes in association with the present environment around the laser diode and with degradation, and thereby accurately predicting a failure time point of the laser diode even in a case of unexpectedly early degradation.

Further, the present failure prediction method predicts a failure of a laser diode by inputting a value of a current that flows through the laser diode and is measured at predetermined time intervals; storing each of the current values in a paired manner with a measurement time of day; detecting a current value at any one of the measurement times of day stored in the storage that has a change greater than or equal to a predetermined value relative to the current value at the preceding measurement time of day; and generating a prediction curve that indicates a relationship between the elapsed time and the current value applicable at and after the measurement time of day of the current value on the basis of the current value detected by the detecting operation and change information concerning a current value corresponding to an elapsed time from beginning of usage of the laser diode.

According to this method, the failure prediction method generates a prediction curve that indicates the relationship between the elapsed time from the beginning of usage of the laser diode and the current value applicable at and after the time of day when the measured current value has a change greater than or equal to the predetermined value relative to the current value at the preceding measurement time of day. Accordingly, current prediction can be performed automatically until the value of the current that flows through the laser diode reaches an overcurrent limit value that indicates the limit value of a current that the laser diode can bear. This permits prediction of a failure time point of the laser diode.

In the above-mentioned method, a failure prediction method is characterized in that the generating operation generates a prediction curve on the basis of the current value detected by the detecting operation; and characteristics information defined in advance on the basis of component characteristics of the laser diode that indicates a change in the current value corresponding to the elapsed time until a failure of the laser diode.

According to this method, the failure prediction method generates a prediction curve that indicates the relationship between the elapsed time and the current value on the basis of the characteristics information defined in advance. Accordingly, even when a current value having a change greater than or equal to a predetermined value relative to the current value at the preceding measurement time of day is detected for the first time, a failure time point of the laser diode can be predicted accurately without the necessity of actual measurement information.

In the above-mentioned method, a failure prediction method is characterized in that the generating operation comprises storing difference information composed of a difference between the current value detected by the detecting operation and the current value at the preceding measurement time of day paired with the elapsed time until the measurement time of day of the current value detected by the detecting operation; judging whether a difference between the current value detected by the detecting operation and a current value corresponding to the measurement time of day of the current value on an already generated prediction curve is greater than or equal to a predetermined value; judging whether the number of difference information pieces stored in the difference information storage operation is greater than or equal to a predetermined value when the curve judging operation judges that the difference is greater than or equal to the predetermined value; and correcting the prediction curve on the basis of the difference information in the difference information storage operation when the number-of-information-pieces judging operation judges that the number of difference information pieces is greater than or equal to the predetermined number, and correcting the prediction curve on the basis of the characteristics information when the number-of-information-pieces judging operation judges that the number of difference information pieces is smaller than the predetermined number.

According to this method the failure prediction method corrects the prediction curve when the current value having a change greater than or equal to the predetermined value relative to the current value at the preceding measurement time of day is not present on the already generated prediction curve, thereby generating a prediction curve corresponding to the current value that changes in association with the present environment around the laser diode and with degradation, and thereby can accurately predict a failure time point of the laser diode. Further, the failure prediction apparatus stores difference information between a current value having a change greater than or equal to a predetermined value relative to the current value at the preceding measurement time of day and the current value at the preceding measurement time of day. Then, when the number of difference information pieces is greater than or equal to a predetermined number, the failure prediction method corrects the prediction curve on the basis of the difference information, thereby can corrects the prediction curve on the basis of the actual measurement, and thereby can more accurately predict a failure time point of the laser diode.

In the above-mentioned method, a failure prediction method is characterized in that the generating operation generates a prediction curve on the basis of the characteristics information and the elapsed time when the elapsed time until the measurement time of day of the current value detected by the detecting operation is shorter than the time indicated in the characteristics information in correspondence to the current value.

According to this method, the failure prediction method generates a prediction curve by taking into consideration the elapsed time corresponding to the current value having a change greater than or equal to the predetermined value relative to the current value at the preceding measurement time of day, thereby generating a prediction curve corresponding to the current value that changes in association with the present environment around the laser diode and with degradation, and thereby can accurately predict a failure time point of the laser diode even in a case of unexpectedly early degradation.

Further, the present failure prediction program is a failure prediction program employed in a failure prediction apparatus for predicting a failure of a laser diode, including causing a computer to execute an input procedure of inputting a value of a current that flows through the laser diode and is measured at predetermined time intervals; a storage procedure of storing each of the current values inputted by said input procedure in a paired manner with a measurement time of day; a detecting procedure of detecting a current value that is a current value at any one of the measurement times of day stored in said storage procedure and that has a change greater than or equal to a predetermined value relative to the current value at the preceding measurement time of day; and a generating procedure of generating a prediction curve that indicates a relationship between said elapsed time and the current value applicable at and after the measurement time of day of the current value detected by said detecting procedure on the basis of the current value detected by said detecting procedure and change information concerning a current value corresponding to an elapsed time from beginning of usage of the laser diode.

According to this program, the failure prediction program generates a prediction curve that indicates the relationship between the elapsed time from the beginning of usage of the laser diode and the current value applicable at and after the time of day when the measured current value has a change greater than or equal to the predetermined value relative to the current value at the preceding measurement time of day. Accordingly, current prediction can be performed automatically until the value of the current that flows through the laser diode reaches an overcurrent limit value that indicates the limit value of a current that the laser diode can bear. This permits prediction of a failure time point of the laser diode.

BEST MODE OF CARRYING OUT THE INVENTION

Hereinafter, embodiments of a failure prediction apparatus, a failure prediction method, and a failure prediction program according to the present invention are described below in detail with reference to the drawings. Here, it should be noted that these embodiments do not place any limit on the scope of the present invention.

FIG. 1 is a diagram showing an example of an overall configuration of an optical transmission system according to an embodiment. As shown in FIG. 1, the optical transmission system includes optical transmission apparatuses 1 to 3. The optical transmission apparatus 1 is connected to n optical transmitters 100-1 to -n. The optical transmission apparatus 1 is connected to the optical transmission apparatus 2 through an optical fiber 200. Further, the optical transmission apparatus 3 is connected to the optical transmission apparatus 2 through an optical fiber 300. The optical transmission apparatus 3 is connected to n optical receivers 380-1 to -n via n optical switches 370-1 to -n.

The optical transmitters 100-1 to -n are apparatuses for transmitting an optical signal. The optical transmitters 100-1 to -n separate and multiplex the optical signals for individual wavelength components such that the optical levels of the optical signals reach a predetermined reference level. The optical transmitters 100-1 to -n then transmit the optical signals to the optical transmission apparatus 1.

An optical switch 110 is a switch for switching the path for the optical signal without converting the optical signal. The optical switch 110 transmits the optical signals transmitted from the optical transmitters 100-1 to -n to optical attenuators 120-1 to -n, respectively.

The optical attenuators 120-1 to -n attenuate the optical levels of the optical signals transmitted from the optical switch 110 to a predetermined optical magnitude level. The optical attenuators 120-1 to -n then transmit the signals to optical receivers 130-1 to -n, respectively.

The optical receivers 130-1 to -n receive the optical signals transmitted from the optical attenuators 120-1 to -n, and then transmit the signals to an optical multiplexer 140.

The optical multiplexer 140 wavelength-multiplexes the optical signals transmitted in a separated state from the optical receivers 130-1 to -n through a plurality of optical cables into one optical cable, so as to transmit the signal to an optical switch 150.

The optical switch 150 transmits the wavelength multiplexed optical signal transmitted from the optical multiplexer 140 to an optical amplifier 160 in the intact form of an optical signal.

The optical amplifier 160 is an apparatus for amplifying a low-level optical signal in the intact form of an optical signal so as to increase the optical level of the optical signal into a predetermined reference level. In the optical amplifier 160, a current supplied to a laser diode generates laser light oscillation so as to amplify the optical signal. The optical amplifier 160 adjusts the current that flows through the laser diode in order to maintain a constant amplified optical signal level. The optical amplifier 160 increases and reduces the amplification level of the laser light generated by oscillation in the laser diode so as to maintain a constant optical level of the optical signal.

Here, the laser diode is degraded gradually when used normally. Thus, the flowing current value needs to be increased in order to maintain a constant optical level of the optical signal. Then, when the value of the current that flows through the laser diode reaches an overcurrent limit value that indicates the limit value of a current that the laser diode can bear, the laser diode fails and cannot transmit an optical signal at a predetermined reference level. Thus, a failure prediction section 180 is required for predicting a failure time point of the laser diode at an early stage.

An optical signal is transmitted from the optical amplifier 160 and has an optical level at or above the predetermined reference level. An optical multiplexer 170 transmits the optical signal to an optical amplifier 210 of the optical transmission apparatus 2 connected through the optical fiber 200.

The failure prediction section 180 is connected to the optical amplifier 160, and predicts the failure of the laser diode contained in the optical amplifier 160. The failure prediction section 180 receives the value of the current that flows through the laser diode from the optical amplifier 160 together with the measurement time of day at predetermined time intervals. The failure prediction section 180 then detects a time point when the current value at the measurement time of day of a particular time point of input has a change greater than or equal to a predetermined value relative to the current value at the preceding measurement time of day. Then, the failure prediction section 180 generates a prediction curve on the basis of the detected current value and change information concerning the value of the current that flows through the laser diode. The prediction curve indicates the relationship between the elapsed time and the current value applicable at and after the time of detection. Here, the change information is characteristics information defined in advance on the basis of the component characteristics of the laser diode. In the alternative, the change information is actual measurement information that stores the current value of an inputted measurement time of day. When the number of actual measurement information pieces is smaller than a predetermined number, the failure prediction section 180 uses the characteristics information. When the number of actual measurement information pieces is greater than or equal to the predetermined number, the actual measurement information is used. Then, the failure prediction section 180 outputs the generated prediction curve onto a terminal. Details of the failure prediction section 180 are described later.

The failure prediction section 180 generates a prediction curve and thereby can automatically predict the current from the beginning of usage of the laser diode until the overcurrent limit value is reached. This permits prediction of a failure time point of the laser diode.

The optical amplifier 210 of the optical transmission apparatus 2 receives the optical signal transmitted from the optical multiplexer 170 of the optical transmission apparatus 1. The optical amplifier 210 then increases the optical level, which was attenuated through the optical fiber 200, to a predetermined reference level. Then, the optical amplifier 210 transmits the optical signal, which has an optical level at or above a predetermined reference level, to an optical branching filter 320 via a dispersion compensator 310 of the optical transmission apparatus 3 connected through the optical fiber 300.

The failure prediction section 220 is connected to the optical amplifier 210. The failure prediction section 220 predicts the failure of the laser diode contained in the optical amplifier 210. Here, the failure prediction section 220 has a configuration similar to that of the failure prediction section 180, and hence description is omitted.

The dispersion compensator 310 corrects waveform distortion generated during the passage of the optical signal through the optical fiber 300 so as to restore the optical signal to a normal waveform.

The optical branching filter 320 transmits to an optical amplifier 330 the optical signal restored into a normal waveform.

The optical amplifier 330 receives the optical signal transmitted from the optical branching filter 320. The optical amplifier 330 then increases the optical level, which was attenuated through the optical fiber 300, to a predetermined reference level. Further, a failure prediction section 360 connected to the optical amplifier 330 predicts the failure of the laser diode contained in the optical amplifier 330. Here, the failure prediction section 360 has a configuration similar to that of the failure prediction section 180, and hence description is omitted.

An optical branching filter 340 separates the optical signal into individual wavelength components. The individual wavelength components are transmitted from the optical amplifier 330 in a state of being wavelength-multiplexed into one optical cable. The individual wavelength components have an optical level at or above a predetermined reference level. Then, the optical branching filter 340 transmits the signals to an optical switch 350.

The optical switch 350 switches and transmits the optical signals, which were separated and transmitted from the optical branching filter 340, to optical switches 370-1 to -n on the outside in the intact form of optical signals.

The optical switches 370-1 to -n transmit the optical signals, which were transmitted from the optical switch 350 of the optical transmission apparatus 3, to respectively connected optical receivers 380-1 to -n in the intact form of optical signals.

The optical receivers 380-1 to -n are apparatuses for receiving optical signals transmitted from the optical switches 370-1 to -n. The optical receivers 380-1 to -n respectively receive optical signals that have an optical level at or above a target level.

Figure 2:
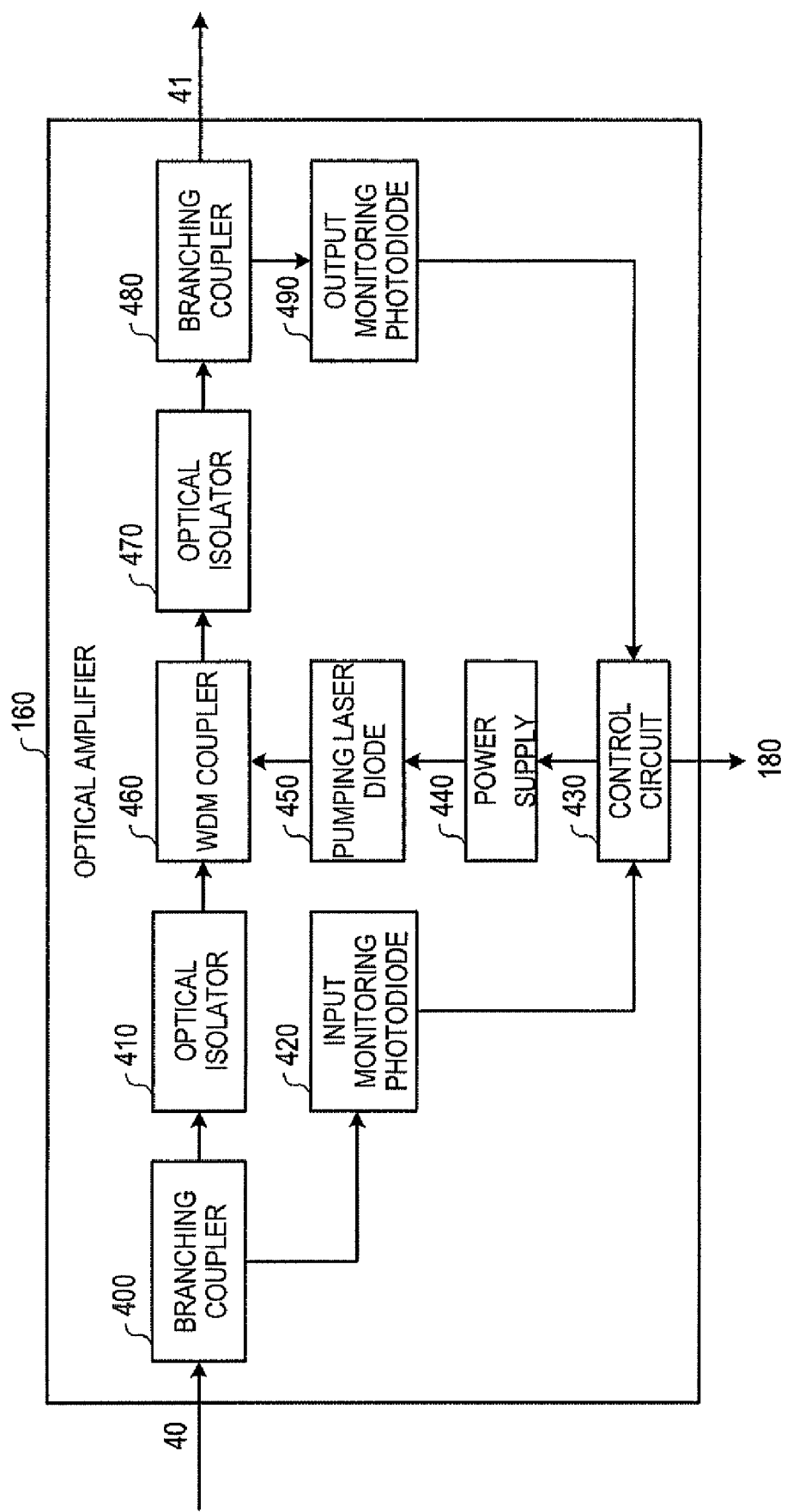
FIG. 2 is a diagram showing a configuration of an optical amplifier according to an embodiment.

Next, the configuration of the optical amplifier 160 containing a laser diode whose failure is to be predicted by the failure prediction section 180 according to the present embodiment is described below with reference to FIG. 2. FIG. 2 is a diagram showing the configuration of an optical amplifier according to the present embodiment. As shown in FIG. 2, the optical amplifier 160 comprises a branching coupler 400, an optical isolator 410, an input monitoring photodiode 420, a control circuit 430, a power supply 440, a pumping laser diode 450, a WDM coupler 460, an optical isolator 470, a branching coupler 480, and an output monitoring photodiode 490.

The branching coupler 400 receives from the outside an input signal 40 composed of an optical signal. The branching coupler 400 then branches the wavelength multiplexed optical signal into the optical isolator 410 and the input monitoring photodiode 420 at a predetermined ratio.

The optical isolator 410 transmits the optical signal transmitted from the branching coupler 400 to the WDM coupler 460, but blocks optical signals that go in the opposite direction for any reason like being reflected by a component such as an optical connecter.

The input monitoring photodiode 420 measures the optical level of the optical signal transmitted from the branching coupler 400. Then, when the measurement result is greater than a reference value, the input monitoring photodiode 420 instructs the control circuit 430 to reduce the current. Here, when the measurement result is smaller than the reference value, the output monitoring photodiode 490 that measures the optical level of the amplified optical signal instructs the control circuit 430 to increase the current. Thus, the input monitoring photodiode 420 does not make instruction to the control circuit 430.

The control circuit 430 is a circuit for controlling the current flowing through the pumping laser diode 450. The control circuit 430 instructs the power supply 440 to increase or reduce the current flowing through the pumping laser diode 450 so the optical signal is amplified with laser light generated by oscillation in the pumping laser diode 450 and the optical level of the input signal 40 is kept constant.

Specifically, when being instructed to reduce the current by the input monitoring photodiode 420 or the output monitoring photodiode 490 described later, the control circuit 430 instructs the power supply 440 to reduce the current. Thus, the current that flows through the pumping laser diode 450 goes lower so that the amplification level of the laser light goes lower. As a result, the control circuit 430 can keep the optical level of the input signal 40 composed of an optical signal constant. On the other hand, when being instructed to increase the current by the output monitoring photodiode 490 described later, the control circuit 430 instructs the power supply 440 to increase the current. Thus, the current that flows through the pumping laser diode 450 goes higher so that the amplification level of the laser light goes higher. As a result, the control circuit 430 can keep the optical level of the input signal 40 composed of an optical signal constant.

Further, the control circuit 430 is connected to the failure prediction section 180. The control circuit 430 measures the value of the current supplied from the power supply 440 to the laser diode 450 at predetermined time intervals. The control circuit 430 then transmits the data to the failure prediction section 180. The failure prediction section 180 receives the measured current value. Then, the failure prediction section 180 generates a prediction curve on the basis of the measured current value and the change information concerning the value of the current that flows through the pumping laser diode 450. The prediction curve indicates the relationship between the elapsed time from the beginning of usage of the pumping laser diode 450 and the current value.

The power supply 440 supplies a current of a magnitude higher or lower than that of the present value to the pumping laser diode 450 in response to the instruction of increasing or reducing the current made by the control circuit 430. Here, when no instruction is made by the control circuit 430, a current of the present magnitude is maintained.

The pumping laser diode 450 oscillates and generates laser light by virtue of the current supplied from the power supply 440. The pumping laser diode 450 then transmits the oscillated laser light to the WDM coupler 460. As such, the pumping laser diode 450 amplifies the optical signal.

The WDM coupler 460 multiplexes the input signal 40 into one optical fiber so as to transmit the multiplexed signal to the optical isolator 470. The input signal 40 is composed of an optical signal transmitted from the optical isolator 410 and the laser light transmitted from the pumping laser diode 450.

The optical isolator 470 transmits the optical signal transmitted from the WDM coupler 460 to the branching coupler 480, but blocks optical signals that go in the opposite direction for any reason.

The branching coupler 480 branches the optical signal transmitted from the optical isolator 470 into an output signal 41 to the outside at a predetermined ratio, and a signal to the output monitoring photodiode 490 at the remaining ratio.

The output monitoring photodiode 490 measures the optical level of the optical signal transmitted from the branching coupler 480. Then, when the measurement result is greater than a reference value, the output monitoring photodiode 490 instructs the control circuit 430 to reduce the current. When the measurement result is smaller than the reference value, the output monitoring photodiode 490 instructs the control circuit 430 to increase the current.

Figure 3:
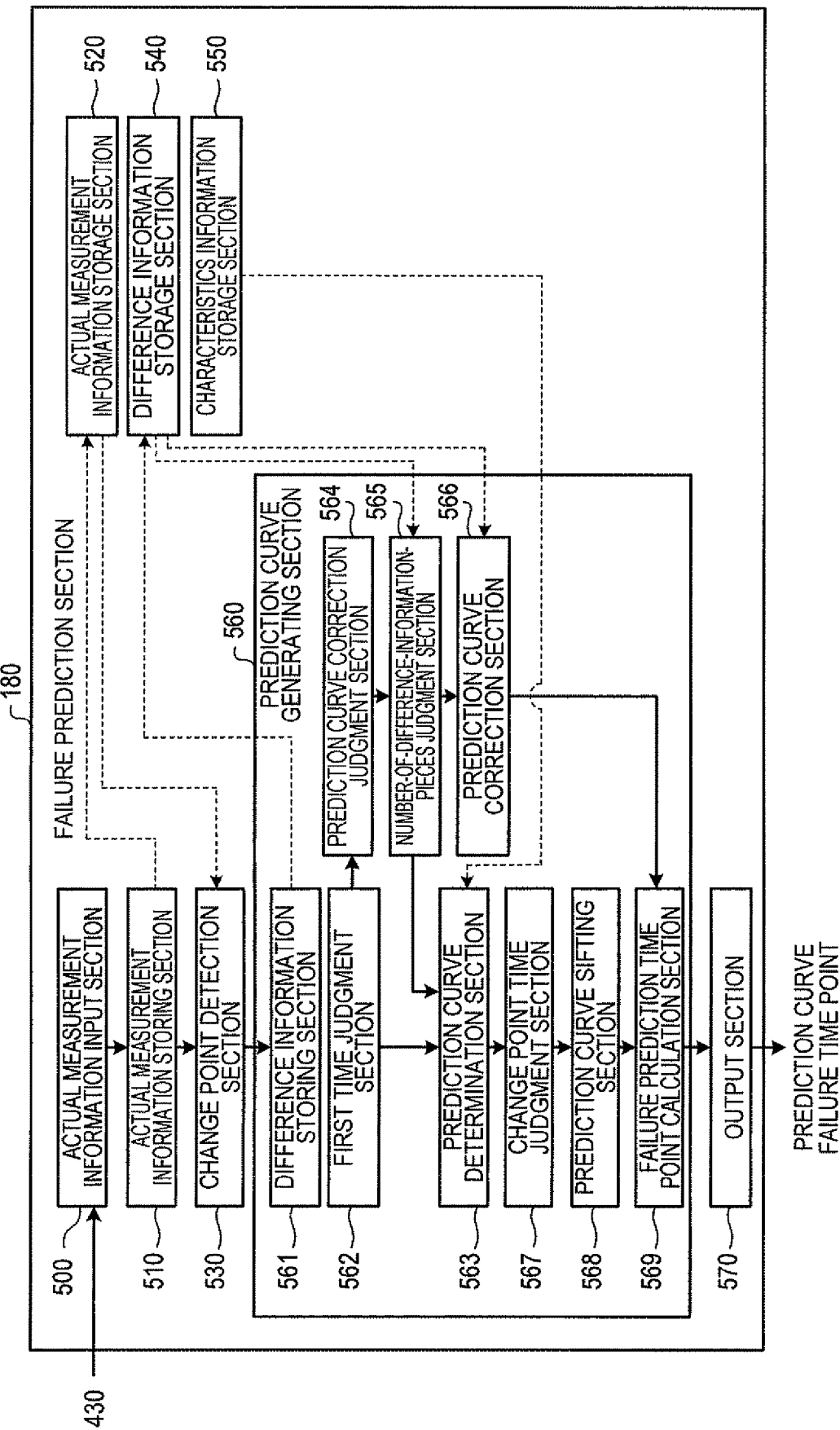
FIG. 3 is a functional block diagram showing a configuration of a failure prediction section according to an embodiment.

Next, the configuration of the failure prediction section 180 according to the present embodiment is described below with reference to FIG. 3. FIG. 3 is a functional block diagram showing the configuration of the failure prediction section. As shown in FIG. 3, the failure prediction section 180 comprises an actual measurement information input section 500, an actual measurement information storing section 510, an actual measurement information storage section 520, a change point detection section 530, a difference information storage section 540, a characteristics information storage section 550, a prediction curve generating section 560, and an output section 570.

The actual measurement information input section 500 acquires the value of the current that flows through the pumping laser diode 450 (simply referred to as the laser diode, hereinafter). The value of the current is actual measurement information measured by the control circuit 430 at predetermined time intervals, together with the measurement time of day. Here, the actual measurement information input section 500 may acquire the actual measurement information in real time or alternatively in a collective manner.

The actual measurement information storing section 510 stores the current value acquired by the actual measurement information input section 500 and the measurement time of day in the actual measurement information storage section 520 in a paired manner. At that time, the actual measurement information storing section 510 stores the temperature around the laser diode into the actual measurement information storage section 520. The actual measurement information storing section 510 may acquire the temperature as actual measurement information through the actual measurement information input section 500, or alternatively may acquire it separately.

The actual measurement information storage section 520 stores the value of the current that flows through the laser diode measured by the control circuit 430 at predetermined time intervals, in a paired manner with the date and time of measurement. Here, a data structure in the actual measurement information storage section 520 is described below with reference to FIG. 4. As shown in FIG. 4, the actual measurement information storage section 520 has specifying information and actual measurement information.

The specifying information is composed of a laser diode identification number that indicates the identification number of an employed laser diode, a component type that indicates the type of the laser diode, and an operation start date that indicates the operation start date of the laser diode. The specifying information is stored on the day the laser diode starts operating. Further, the actual measurement information contains the date and time of measurement by the control circuit 430 acquired by the actual measurement information input section 500, the temperature around the laser diode, the current value measured by the control circuit 430 acquired by the actual measurement information input section 500, and the output optical power that indicates the optical level of the optical signal amplified with the laser generated by oscillation in the laser diode. Here, the temperature is preferably measured by a thermometer located as near the laser diode as possible.

Returning to FIG. 3, the change point detection section 530 detects a current value that is stored by the actual measurement information storing section 510 at the present measurement time of day and that has a change greater than or equal to a predetermined value relative to the current value at the preceding measurement time of day. The time point of the measurement time of day of the detected current value is referred to as a change point, hereinafter. Here, when the actual measurement information input section 500 collectively acquires the measured current value, the change point detection section 530 may detect a current value that is a current value at an arbitrary measurement time of day and that has a change greater than or equal to a predetermined value relative to the current value at the preceding measurement time of day.

Figure 5:
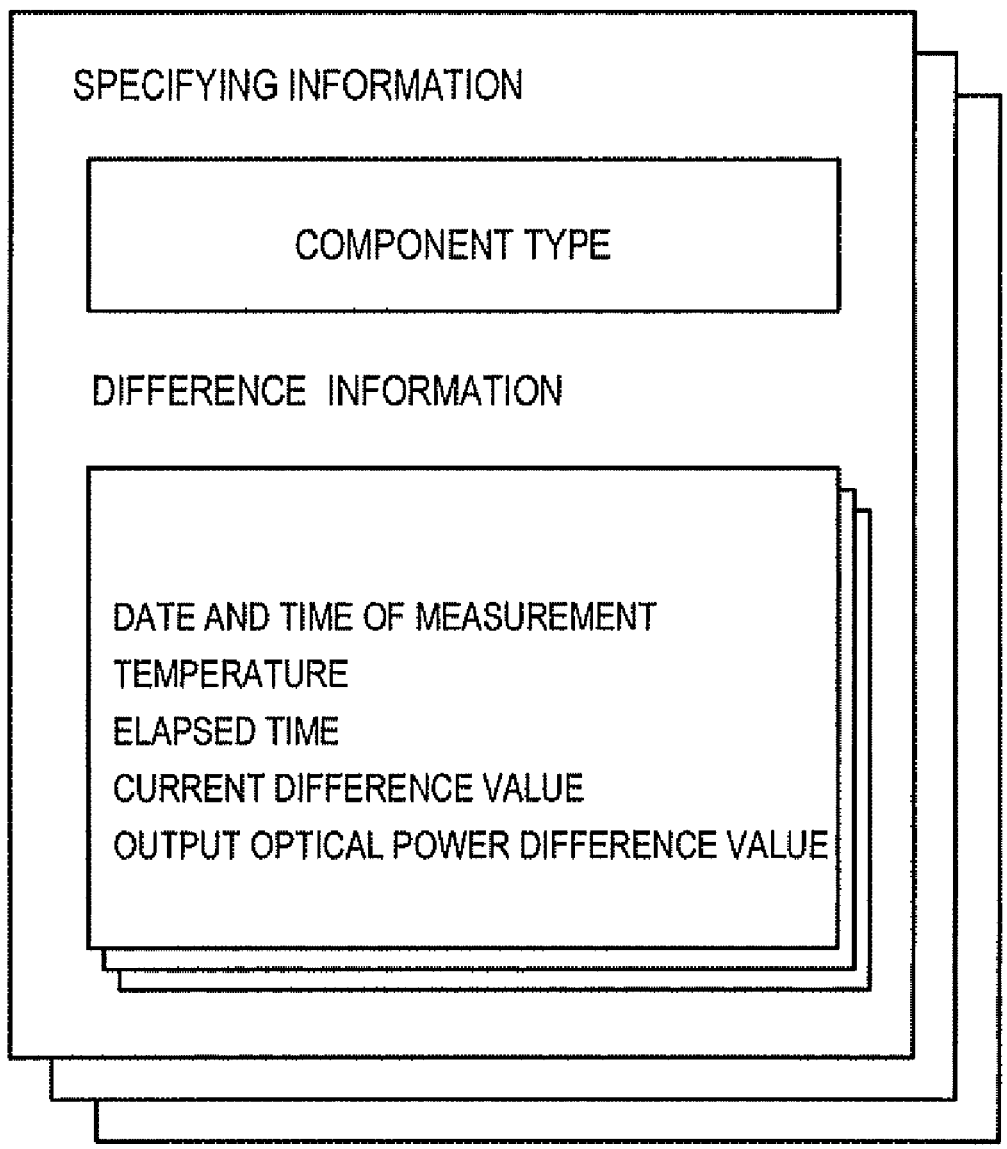
FIG. 5 is a diagram showing an example of data structure in a difference information storage section according to an embodiment.

The difference information storage section 540 stores the difference information between the current value detected by the change point detection section 530 and the current value at the preceding measurement time of day. Here, a data structure in the difference information storage section 540 is described below with reference to FIG. 5. As shown in FIG. 5, the difference information storage section 540 has specifying information and difference information.

The specifying information contains a component type that indicates the type of the laser diode. The component type is stored in advance before starting operation of the laser diode. Further, the difference information contains, the date and time of measurement of a change point, the temperature around the laser diode at the date and time of measurement of the change point, the elapsed time from the beginning of usage of the laser diode the current difference value which is the difference between the current value at the change point and the current value at the preceding measurement time of day, and the output optical power difference value which is the difference between the value of the output optical power at the change point and the value of the output optical power at the preceding measurement time of day.

The characteristics information storage section 550 stores the current value at the change point and characteristics information. The characteristics information is defined in advance on the basis of component characteristics of the laser diode and indicates a change in the current value corresponding to the elapsed time until a failure of the laser diode. That is, the characteristics information storage section 550 stores the average failure advancing situation acquired by an accelerated test for the laser diode performed before the beginning of usage of the laser diode and by the component characteristics information for the laser diode. The characteristics information is stored for each component type of the laser diode and for each value of the temperature around the laser diode. Here, a data structure in the characteristics information storage section 550 is described below with reference to FIG. 6. Here, although the characteristics information storage section 550 stores the characteristics information for each value of the temperature around the laser diode, the present invention is not limited to this approach.

Figure 6:
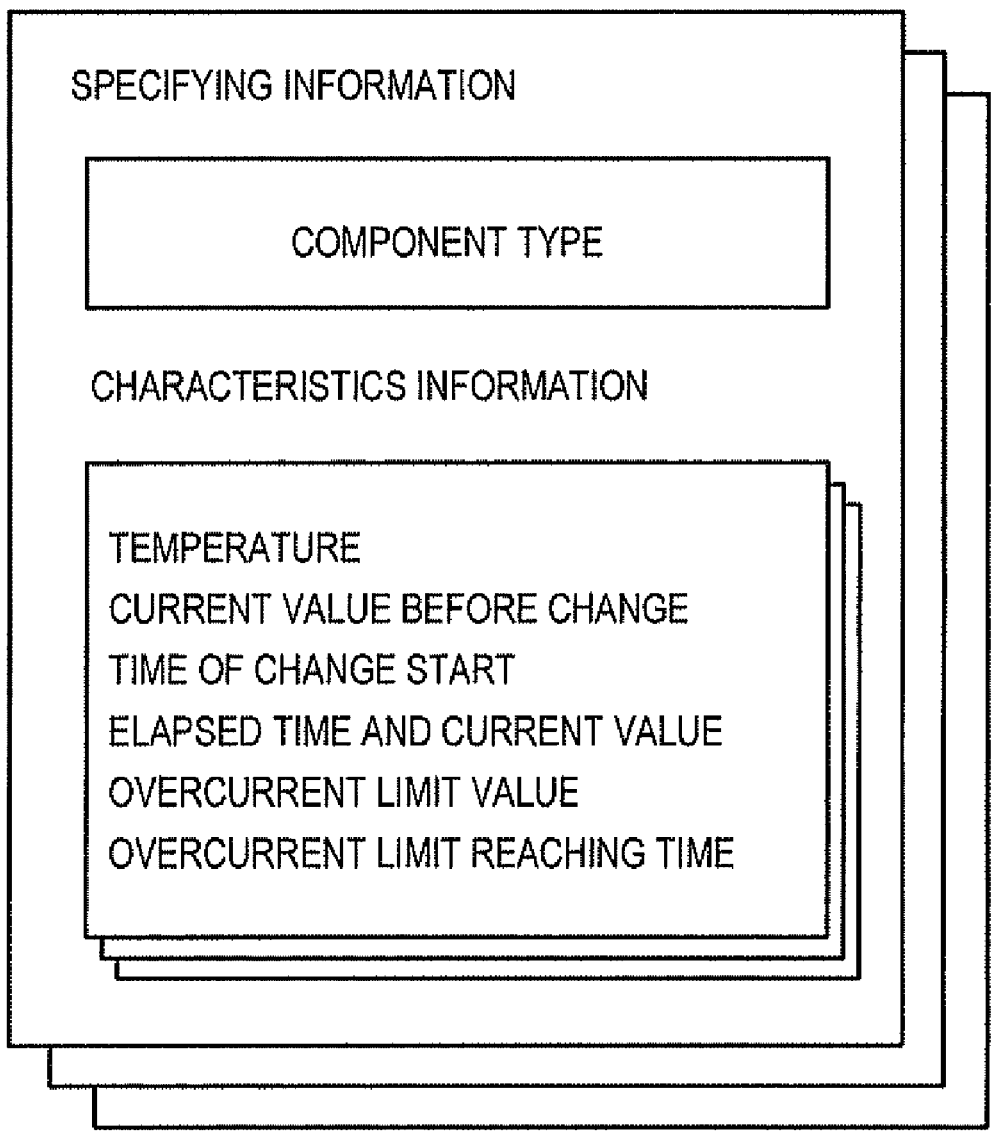
FIG. 6 is a diagram showing an example of data structure in a characteristics information storage section according to an embodiment.

As shown in FIG. 6, the characteristics information storage section 550 has specifying information and characteristics information. The specifying information contains a component type that indicates the type of the laser diode. Further, the characteristics information is composed of: the temperature around the laser diode, the current value before a change, the change start time that indicates the elapsed time of the first change point, the elapsed time and the current value at change points after the first change point, the overcurrent limit value that indicates the limit value of a current that the laser diode can bear, and the overcurrent limit reaching time that indicates the time until the value of the current that flows through the laser diode reaches the overcurrent limit value.

Returning to FIG. 3, the prediction curve generating section 560 comprises a difference information storing section 561, a first time judgment section 562, a prediction curve determination section 563, a prediction curve correction judgment section 564, a number-of-difference-information-pieces judgment section 565, a prediction curve correction section 566, a change point time judgment section 567, a prediction curve shifting section 568, and a failure prediction time point calculation section 569.

The difference information storing section 561 stores difference information into the difference information storage section 540. The difference information is composed of a pair of: the difference between the current value detected by the change point detection section 530 and the current value at the preceding measurement time of day; and the elapsed time from the beginning of usage of the laser diode corresponding to the measurement time of day of the detected current value.

The first time judgment section 562 judges whether the number of times of detection of the change point indicates the first time. The judgment whether the number of times of detection of the change point indicates the first time may be performed in the first time judgment section 562 by using a flag set up in a memory (not shown). That is, when the failure prediction section 180 is in an initial state immediately after the startup, the failure prediction section 180 stores, into the first time judgment flag, OFF ("0") that indicates the first time. Then, the first time judgment section 562 refers to the flag so as to judge whether the detection is for the first time. Further, after the judgment whether the detection is for the first time, the first time judgment section 562 stores, into the first time judgment flag, ON ("1") that indicates the completion of the first-time judgment.

When the first time judgment section 562 judges that the number of times of detection of the change point indicates the first time, the prediction curve determination section 563 generates a prediction curve that indicates the relationship between the elapsed time and the current value applicable at and after the change point. The prediction curve determination section 563 generates the prediction curve on the basis of the current value detected by the change point detection section 530 and the characteristics information stored in the characteristics information storage section 550. Further, when the number-of-difference-information-pieces judgment section 565 described later judges that the number of difference information pieces is smaller than a predetermined number, the prediction curve determination section 563 corrects the already generated prediction curve on the basis of the current value detected by the change point detection section 530 and the characteristics information stored in the characteristics information storage section 550.

Specifically, on the basis of the temperature stored by the actual measurement information storing section 510 into the actual measurement information storage section 520, the prediction curve determination section 563 reads the characteristics information in the characteristics information storage section 550. Then, the prediction curve determination section 563 calculates a curve formula that indicates the relationship between the elapsed time from the change start time to the overcurrent limit reaching time when the overcurrent limit value is reached and the current value among the read-out characteristics information. The curve formula may be obtained, for example, by a polynomial approximating method. Further, the prediction curve determination section 563 stores the overcurrent limit value and the curve formula into a memory (not shown).

As such, the prediction curve determination section 563 generates a prediction curve on the basis of the characteristics information in the characteristics information storage section 550. The prediction curve indicates the relationship between the elapsed time and the current value. Thus, even when the number of times of detection of the change point indicates the first time, a failure time point of the laser diode can accurately be predicted without the necessity of actual measurement information. Further, the prediction curve determination section 563 corrects the prediction curve, thereby generating a prediction curve corresponding to the current value that changes in association with the present environment around the laser diode and with degradation, and accurately predicting a failure time point of the laser diode.

When the first time judgment section 562 judges that the number of times of detection of the change point does not indicate the first time, the prediction curve correction judgment section 564 judges whether the difference between the current value detected by the change point detection section 530 and a current value corresponding to the measurement time of day of the current value on the already generated prediction curve is greater than or equal to a predetermined value.

When the prediction curve correction judgment section 564 judges that the difference is greater than or equal to the predetermined value, the number-of-difference-information-pieces judgment section 565 judges whether the number of difference information pieces stored in the difference information storage section 540 is greater than or equal to a predetermined number.

When the number-of-difference-information-pieces judging section 565 judges that the number of difference information pieces is greater than or equal to the predetermined number, the prediction curve correction section 566 corrects the curve formula on the basis of the current value detected by the change point detection section 530 and the difference information in the difference information storage section 540. Specifically, on the basis of the temperature stored by the actual measurement information storing section 510 into the actual measurement information storage section 520, the prediction curve correction section 566 reads the difference information from the difference information storage section 540. Then, the prediction curve correction section 566 calculates the current value at the preceding elapsed time from: the current value at the change point detected by the change point detection section 530; and the current difference value corresponding to the change point among the plurality of difference information pieces. Then, the prediction curve correction section 566 calculates the current value at the second preceding elapsed time from the obtained current value and the current difference value corresponding to the preceding elapsed time among the difference information. Then, the prediction curve correction section 566 repeats the calculation of a plurality of difference information pieces and current values at the past change points. The prediction curve correction section 566 calculates a curve formula that indicates the relationship between the elapsed time and the current value applicable at and after the first-time change point using the calculated current values at the past change points. The curve formula may be obtained, for example, by a polynomial approximating method.

As such, the prediction curve correction section 566 corrects the prediction curve, thereby generating a prediction curve corresponding to the current value that changes in association with the present environment around the laser diode and with degradation, and accurately predicting a failure time point of the laser diode. Further, the prediction curve correction section 566 corrects the prediction curve on the basis of the difference information in the difference information storage section 540 so as to correct the prediction curve on the basis of the actual measurement, and thereby can more accurately predict a failure time point of the laser diode.

The change point time judgment section 567 judges whether the elapsed time from the beginning of usage of the laser diode to the measurement time of day corresponding to the current value detected by the change point detection section 530 is shorter than the time corresponding to the current value among the values indicated in the characteristics information in the characteristics information storage section 550. Specifically, the change point time judgment section 567 converts the measurement time of day for the current value detected by the change point detection section 530 into the elapsed time from the beginning of usage of the laser diode. Then, the change point time judgment section 567 obtain an elapsed time corresponding to the detected current value among the values stored in the characteristics information in the characteristics information storage section 550. Then, the change point time judgment section 567 judges whether the converted elapsed time is shorter than the elapsed time obtained from the characteristics information.

When the change point time judgment section 567 judges that the converted elapsed time is shorter than the elapsed time obtained from the characteristics information, the prediction curve shifting section 568 corrects the curve formula generated by the prediction curve determination section 563 into a curve formula corresponding to the elapsed time converted by the change point time judgment section 567. Specifically, the prediction curve shifting section 568 moves the elapsed time indicated in the characteristics information in the characteristics information storage section 550 to the elapsed time converted by the change point time judgment section 567, and thereby corrects the curve formula that indicates the relationship between the elapsed time from the change start time to the overcurrent limit reaching time when the overcurrent limit value is reached and the current value.

As such, the prediction curve shifting section 568 corrects the prediction curve with taking into consideration the measured current value, thereby can generate a prediction curve corresponding to the current value that changes in association with the present environment around the laser diode and with degradation. Thus, a failure time point can accurately be predicted even in case of unexpectedly early degradation in the laser diode.

The failure prediction time point calculation section 569 calculates a failure time point of the laser diode on the basis of the curve formula generated by the prediction curve determination section 563, the prediction curve correction section 566, or the prediction curve shifting section 568; and the elapsed time at the change point detected by the change point detection section 530. Specifically, the failure prediction time point calculation section 569 calculates an elapsed time corresponding to the overcurrent limit value stored in a memory (not shown) on the basis of the generated curve formula, and then subtracts from that elapsed time the elapsed time at the change point so as to obtain a failure time point.

The output section 570 outputs a prediction curve that indicates the relationship between the elapsed time and the current value applicable at and after the change point on the basis of the curve formula generated by the prediction curve determination section 563, the prediction curve correction section 566, or the prediction curve shifting section 568 and the overcurrent limit value stored in a memory (not shown). Further, the output section 570 outputs the failure time point calculated by the failure prediction time point calculation section 569.

As such, the failure prediction section 180 generates a prediction curve that indicates the relationship between the elapsed time and the current value applicable at and after the change point, and can perform thereby automatic current prediction from the beginning of usage of the laser diode to the time point when the current reaches the overcurrent limit value that indicates the limit value of a current that the laser diode can bear. As a result, a failure time point of the laser diode can be predicted automatically.

Further, in the optical transmission apparatus, the failure prediction section 180 recognizes a failure time point of the laser diode. Thus, in a case that the optical amplifier containing the laser diode is duplexed, when a time point before the failure time point is set up, the system can automatically be switched to a reserve system. This permits high reliability. Alternatively, a maintenance person may manually switch the system to the reserve system before the predicted failure time point.

Figure 7:
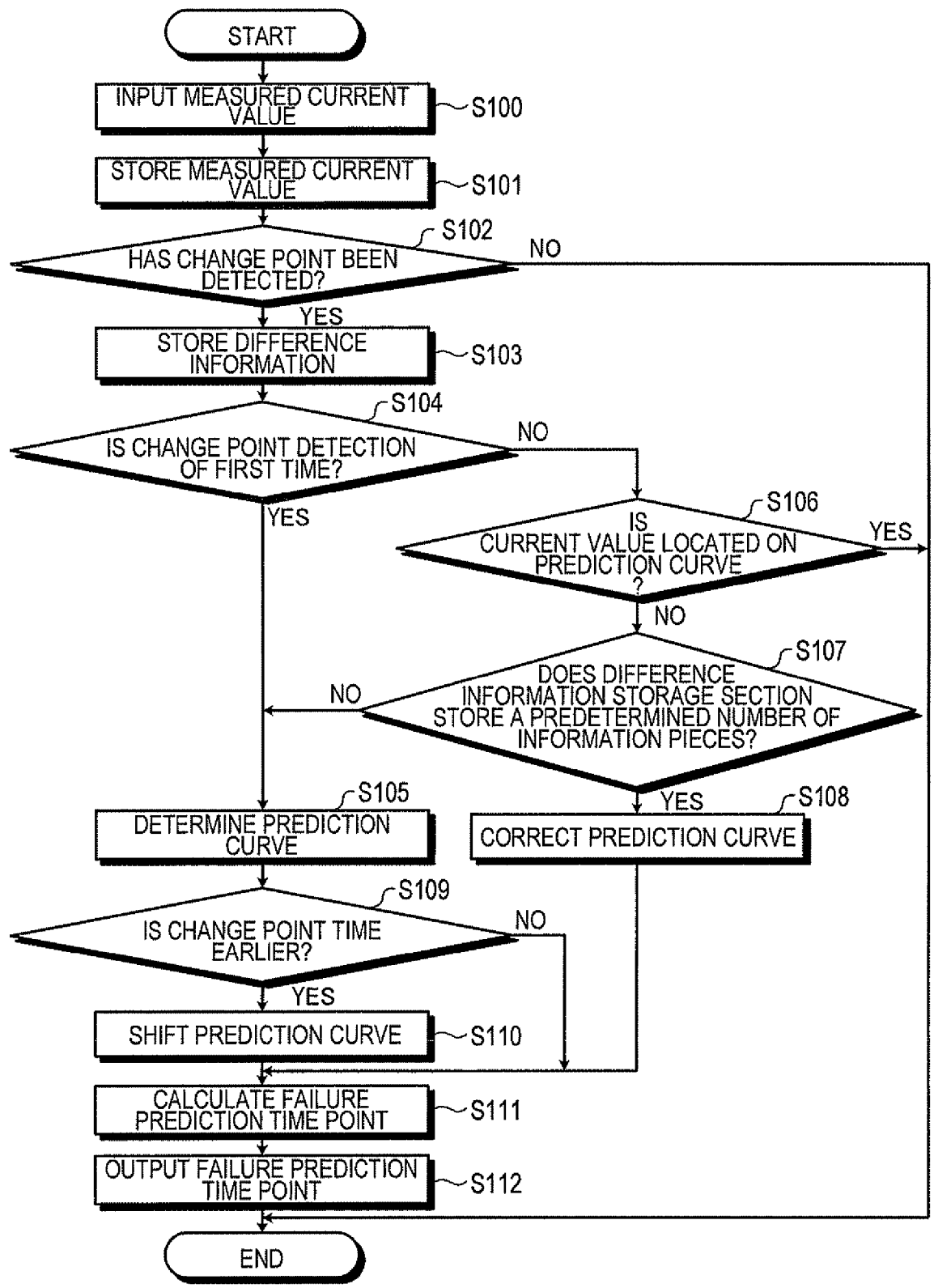
FIG. 7 is a flow chart showing a process performed by a failure prediction section according to an embodiment.

Next, the process performed by the failure prediction section 180 according to the present embodiment is described below with reference to FIG. 7. FIG. 7 is a flow chart showing the process performed by the failure prediction section 180.

First, a measured current value measured by the control circuit 430 is inputted to the actual measurement information input section 500 (S100). At that time, the actual measurement information input section 500 acquires simultaneously the measurement time of day when the measured current value was measured.

Next, the actual measurement information storing section 510 stores into the actual measurement information storage section 520 the measured current value inputted by the actual measurement information input section 500 (S101). At that time, the actual measurement information storing section 510 stores into the actual measurement information storage section 520 the measurement time of day acquired simultaneously by the actual measurement information input sections 500 and the temperature around the laser diode. Here, the actual measurement information storing section 510 may acquire the temperature in a different manner.

Next, the change point detection section 530 judges whether the measured current value stored by the actual measurement information storing section 510 is a change point (S102). Specifically, the change point detection section 530 reads the measured current value at the preceding measurement time of day from the actual measurement information in the actual measurement information storage section 520. Then, the change point detection section 530 judges whether the measured current value at the present measurement time of day stored by the actual measurement information storing section 510 has a change greater than or equal to a predetermined value relative to the measured current value at the preceding measurement time of day.

When the change point detection section 530 judges that the measured current value stored by the actual measurement information storing section 510 is not a change point (S102 No), the process is terminated.

On the other hand, when the change point detection section 530 judges that the measured current value stored by the actual measurement information storing section 510 is a change point (S102 Yes), the difference information storing section 561 stores into the difference information storage section 540 the difference information between the measured current value detected by the change point detection section 530 and the measured current value at the preceding measurement time of day (S103). At that time, the difference information storing section 561 stores the elapsed time from the beginning of usage of the laser diode corresponding to the measurement time of day of the measured current value detected by the change point detection section 530, in a manner of being included in the difference information.

Then, when a change point is detected by the change point detection section 530, the first time judgment section 562 judges whether the number of times of detection of the change point indicates the first time (S104). Specifically, the first time judgment section 562 refers to the first time judgment flag that indicates whether the number of times of detection of the change point indicates the first time. Then, when the flag is OFF ("0") that indicates the first time, it is judged as being the first time. When the flag is ON ("1") that indicates the completion of the first-time judgment, it is judged as not being the first time. Here, after the judgment of whether it is the first time, the first time judgment section 562 stores ON ("1") into the first time judgment flag.

When the first time judgment section 562 judges that the number of times of detection of the change point detected by the change point detection section 530 indicates the first time (S104 Yes), on the basis of the measured current value detected by the change point detection section 530, the prediction curve determination section 563 determines a prediction curve that indicates the relationship between the elapsed time and the current value applicable at and after the change point (S105). Specifically, on the basis of the temperature stored in the actual measurement information storage section 520, the prediction curve determination section 563 reads the characteristics information from the characteristics information storage section 550. Then, the prediction curve determination section 563 calculates a curve formula that indicates the relationship between the elapsed time from the change start time to the overcurrent limit reaching time when the overcurrent limit value is reached and the current value among the read-out characteristics information. At that time, the prediction curve determination section 563 stores into a memory (not shown) the calculated curve formula and the overcurrent limit value.

Then, the change point time judgment section 567 judges whether the measurement time of day at the change point detected by the change point detection section 530 is earlier than a predetermined time of day (S109). Specifically, the change point time judgment section 567 converts into the elapsed time the measurement time of day of the change point detected by the change point detection section 530. Then, from the characteristics information in the characteristics information storage section 550, the change point time judgment section 567 obtains an elapsed time that agrees with the current value at the change point. Then, the change point time judgment section 567 judges whether the converted elapsed time is shorter than the elapsed time obtained from the characteristics information.

When the change point time judgment section 567 judges that the measurement time of day at the change point is earlier (S109 Yes), the prediction curve shifting section 568 corrects the prediction curve on the basis of the elapsed time at the change point (S110). Specifically, the prediction curve shifting section 568 moves the elapsed time obtained from the characteristics information in the characteristics information storage section 550 to the elapsed time at the change point, and thereby corrects the curve formula.

On the other hand, when the first time judgment section 562 judges that the number of times of detection of the change point detected by the change point detection section 530 does not indicate the first time (S104 No), the prediction curve correction judgment section 564 judges whether the measured current value at the change point is located on the prediction curve (S106). Specifically, the prediction curve correction judgment section 564 judges whether the difference between the measured current value at the change point and the current value corresponding to the measurement time of day of the measured current value in the curve formula of the already generated prediction curve is greater than or equal to a predetermined value.

When the prediction curve correction judgment section 564 judges that the measured current value at the change point detected by the change point detection section 530 is located on the prediction curve (S106 Yes), the process is terminated.

On the other hand, the prediction curve correction judgment section 564 judges that the measured current value at the change point detected by the change point detection section 530 is not located on the prediction curve (S106 No), the number-of-difference-information-pieces judgment section 565 judges whether the difference information storage section 540 has a predetermined number of difference information pieces (S107).

When the number-of-difference-information-pieces judgment section 565 concludes the presence of a predetermined number of difference information pieces (S107 Yes), the prediction curve correction section 566 corrects the prediction curve on the basis of the measured current value detected by change point detector 530 (S108). Specifically, the prediction curve correction section 566 reads the difference information from the difference information storage section 540. Then, on the basis of the measured current value detected by the change point detection section 530 and the elapsed time and the current difference value belonging to the read difference information, the prediction curve correction section 566 corrects the curve formula of the prediction curve.

On the other hand, the number-of-difference-information-pieces judgment section 565 concludes the absence of a predetermined number of difference information pieces (S107 No), the prediction curve determination section 563 determines again a prediction curve on the basis of the measured current value detected by the change point detection section 530 (S105). Here, details of the prediction curve determination section 563 are as described above.

Then, the change point time judgment section 567 judges whether the measurement time of day at the change point detected by the change point detection section 530 is earlier than a predetermined time of day (S109). Here, details of the change point time judgment section 567 are as described above.

Then, when the change point time judgment section 567 judges that the measurement time of day at the change point is earlier (S109 Yes), the prediction curve shifting section 568 corrects the prediction curve on the basis of the elapsed time at the change point (S110). Here, details of the prediction curve shifting section 568 are as described above.

Then, on the basis of the curve formula of the prediction curve and the elapsed time at the change point detected by the change point detection section 530, the failure prediction time point calculation section 569 calculates a failure prediction time point (S111). Specifically, the failure prediction time point calculation section 569 calculates an elapsed time corresponding to the overcurrent limit value stored in a memory (not shown) on the basis of the determined or corrected curve formula of the prediction curve, and then subtracts from that elapsed time the elapsed time at the change point.

Then, the output section 570 outputs onto a terminal (not shown) the curve formula of the prediction curve and the failure prediction time point calculated by the failure prediction time point calculation section 569 (S112).

Figure 8:
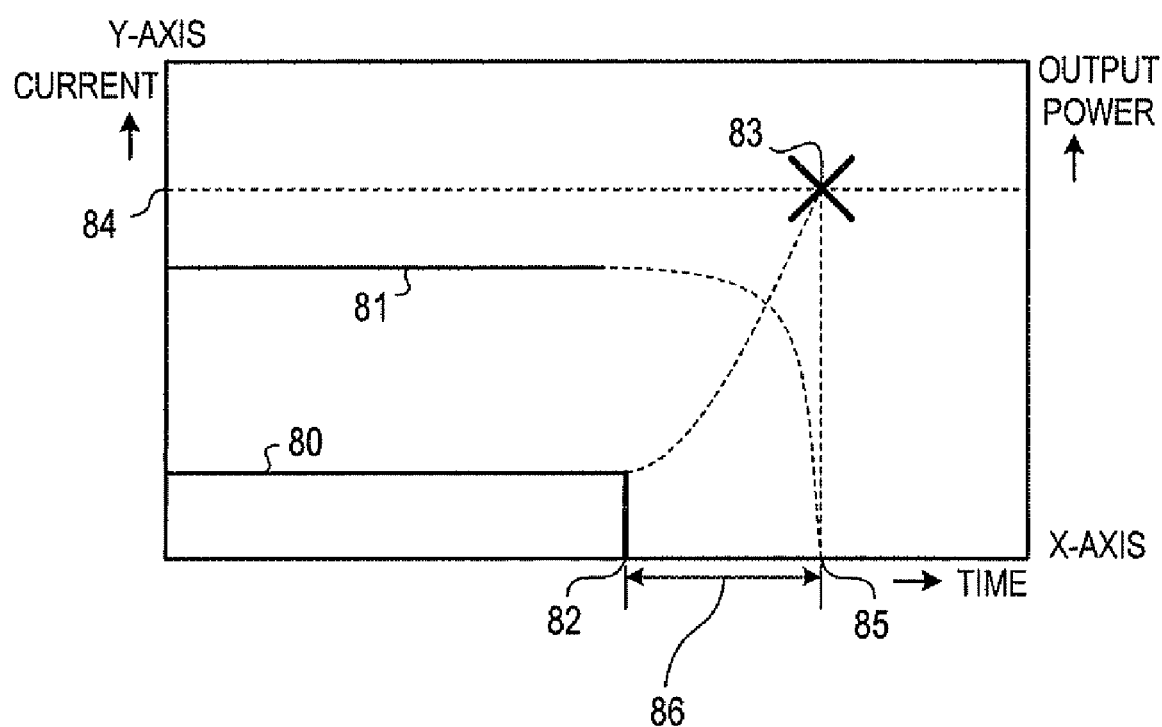
FIG. 8 is a diagram showing principles of failure prediction according to an embodiment.

Next, the principles of failure prediction based on the value of the current that flows through the laser diode inputted by the failure prediction section 180 according to the present embodiment are described below with reference to FIG. 8. FIG. 8 is a diagram showing the principles of failure prediction according to the present invention. As shown in FIG. 8, the X-axis indicates the time, while the Y-axis indicates the current value.

The actual measurement information input section 500 acquires the value of a bias current 80 which is a current that flows through the laser diode and that is corrected in accordance with the adjustment instruction from the control circuit, together with the measurement time of day. Time continues in which the value of the acquired bias current 80 falls within a predetermined value range relative to the current value at the preceding measurement time of day. At that time, the output of optical power 81 that indicates the optical level of the optical signal is maintained at a particular fixed output level. Then, the change point detection section 530 detects a change point 82 indicating a time point corresponding to the current value that is a value of the bias current 80 in a particular measurement time of day and that has a change greater than or equal to a predetermined value relative to the value of the bias current 80 at the preceding measurement time of day. Then, the prediction curve determination section 563 or the prediction curve correction section 566 generates a prediction curve that indicates the relationship between the time elapsed from the beginning of usage of the laser diode and the current value applicable at and after the change point 82.

The value of the bias current 80 of the prediction curve increases as time progresses at and after the change point 82. On the other hand, the output of optical power 81 that indicates the optical level of the optical signal decreases as time progresses at and after the change point 82. Then, from the prediction curve, the failure prediction time point calculation section 569 calculates a time point corresponding to the overcurrent limit value 84 that indicates the limit value of a current that the laser diode can bear. Then, the time point is adopted as a failure prediction time point 85. At this time point, the laser diode goes into failure occurrence 83. Then, the failure prediction time point calculation section 569 subtracts the time of change point 82 from the failure prediction time point 85, and then adopts the result as the predicted remaining life 86 that indicates a failure prediction time point relative to the change point 82.

Figure 9:
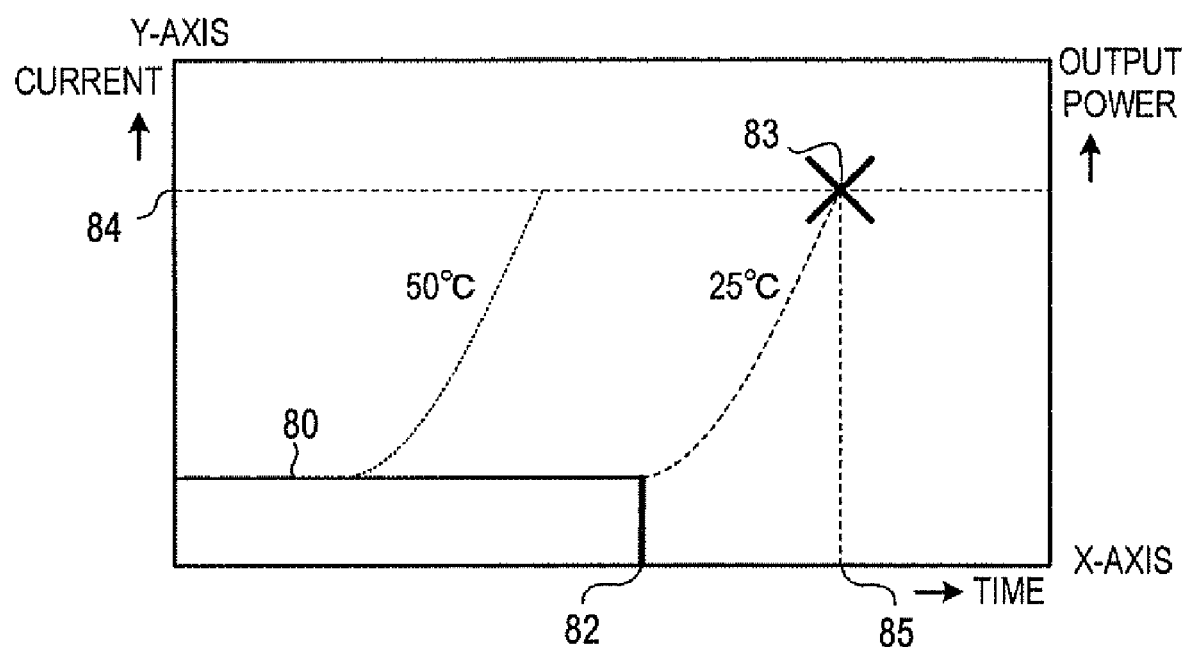
FIG. 9 is a diagram showing first-time failure prediction.

Next, FIG. 9 is a diagram showing failure prediction at the first time performed by the failure prediction section 180 according to the present embodiment. As shown in FIG. 9, the X-axis indicates the time, while the Y-axis indicates the current value.

Specifically, the prediction curve determination section 563 generates a prediction curve that indicates the relationship between the time elapsed from the beginning of usage of the laser diode and the current value applicable at and after the change point 82. The prediction curve is generated on the basis of the value of the bias current 80 at the change point 82 and the component characteristics of the laser diode defined in advance in the characteristics information storage section 550. In general, the value of the bias current 80 necessary for keeping the optical level of the optical signal constant varies depending on the temperature around the laser diode. Thus, for example, the change point 82 is reached earlier in a case that the temperature around the laser diode is 25° C. than in a case of 50° C.

Figure 10:
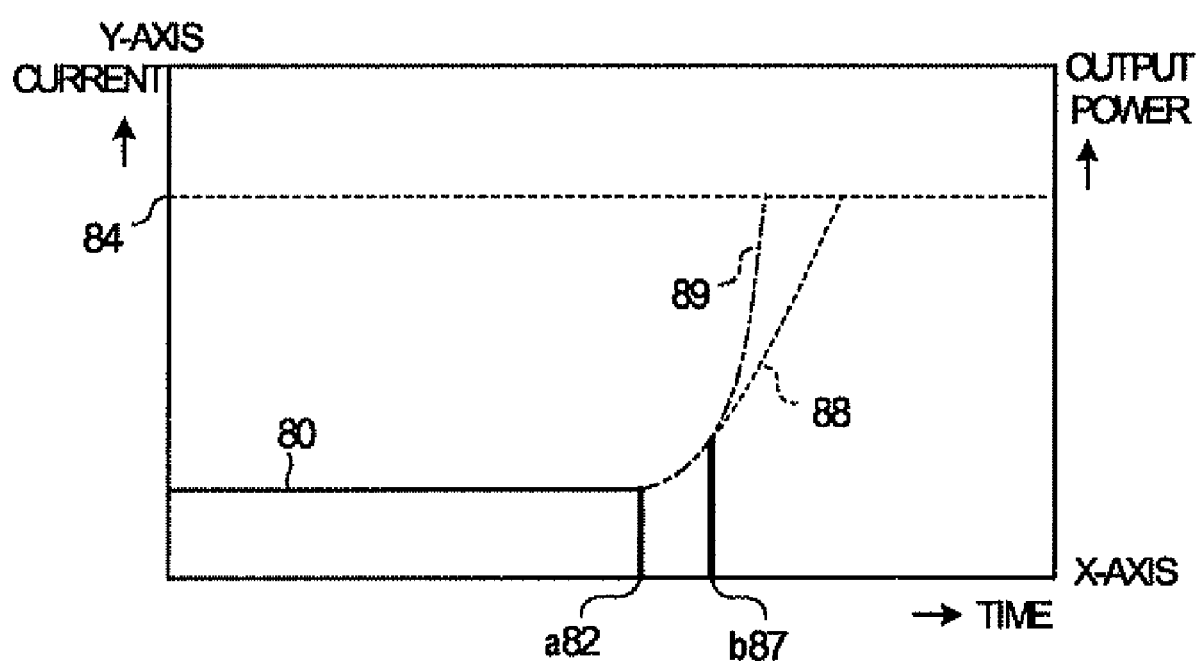
FIG. 10 is a diagram showing prediction of a failure at the second time or later.

Next, FIG. 10 is a diagram showing failure prediction at the second time or later performed by the failure prediction section 180 according to the present embodiment. As shown in FIG. 10, the X-axis indicates the time, while the Y-axis indicates the current value.

Specifically, first, when the first time judgment section 562 judges as being the first time, the prediction curve determination section 563 generates a prediction curve applicable at and after the first change point a82. Next, when the first time judgment section 562 judges as being the second time or later (not being the first time) and the number-of-difference-information-pieces judgment section 565 judges that the number of difference information pieces stored in the difference information storage section 540 is smaller than a predetermined number, the prediction curve determination section 563 corrects the prediction curve applicable at and after the second change point b87 on the basis of the information stored in the characteristics information storage section 550. Further, when the first time judgment section 562 judges as being the second time or later (not being the first time) and the number-of-difference-information-pieces judgment section 565 judges that the number of difference information pieces stored in the difference information storage section 540 is greater than or equal to a predetermined number, the prediction curve determination section 563 corrects the prediction curve applicable at and after the second change point b87 on the basis of the information stored in the difference information storage section 540.

Figure 11:
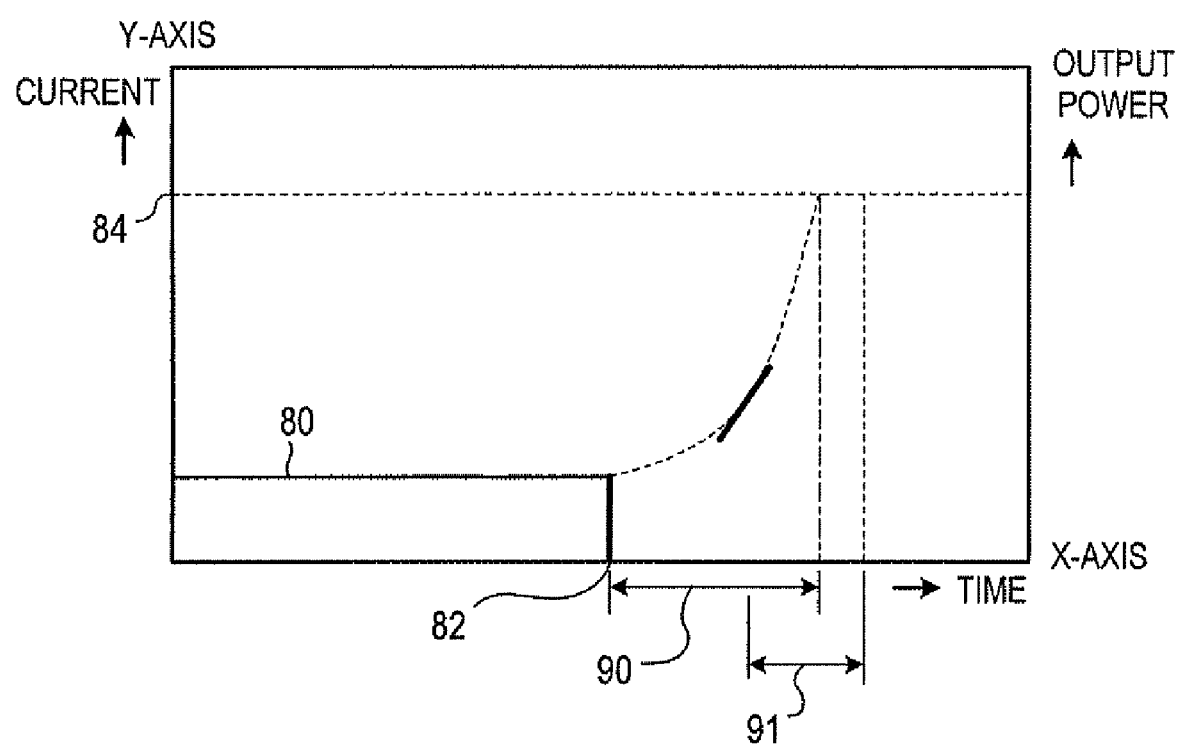
FIG. 11 is a diagram showing an example of usage of a failure prediction section according to an embodiment.

Next, FIG. 11 is a diagram showing an example of use of the failure prediction section 180 according to the present embodiment. In FIG. 11, the X-axis indicates the time, while the Y-axis indicates the current value.

Specifically, the failure prediction section 180 outputs, onto the terminal or the like, the generated prediction curve applicable at and after the change point 82 and the predicted remaining life 90 that is calculated by the failure prediction time point calculation section 569 and that indicates a failure prediction time point after the change point 82. Thus, a maintenance person can recognize the outputted predicted remaining life 90, and further can obtain the inclination at a particular time point on the prediction curve so as to calculate the predicted remaining life 91 relative to a particular time point.

Figure 12:
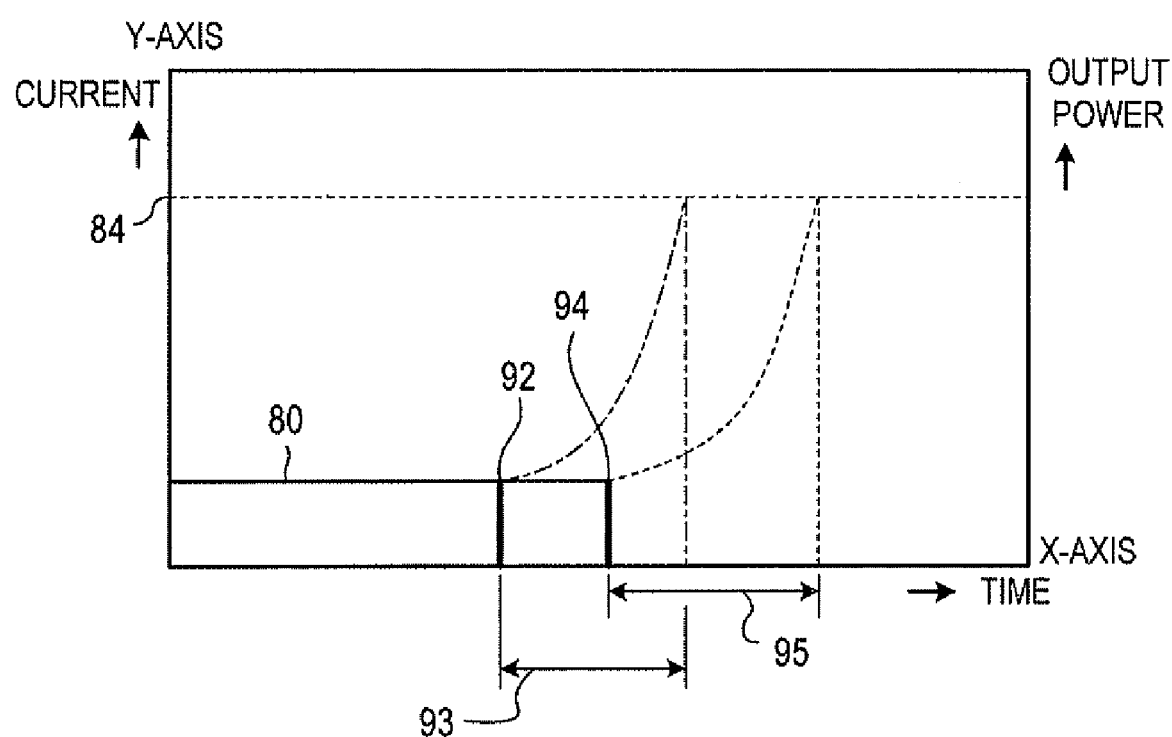
FIG. 12 is a diagram showing a case that a change point obtained by actual measurement is earlier than a change point expected at the time of network design.

Further, FIG. 12 shows an example of use of the failure prediction section 180 according to the present embodiment, in a case that a change point obtained by actual measurement is earlier than a change point expected at the time of network design. As shown in FIG. 12, the X-axis indicates the time, while the Y-axis indicates the current value.

The failure prediction section 180 outputs onto the terminal or the like the prediction curve based on the actual measurement applicable at and after the change point 92 and the predicted remaining life 93 based on the actual measurement. Thus, when the predicted remaining life 93 on the generated prediction curve is compared with the predicted remaining life 95 applicable at and after the change point 94 predicted in advance at the time of network design, a maintenance person can recognize that the laser diode is degraded earlier than expected at the time of network design. Here, the failure prediction section 180 may store in advance the current value and the time applicable at and after the change point 94 expected at the time of network design. Then, an alarm may be outputted onto the terminal when the change point 92 based on the actual measurement is earlier than the change point 94 expected at the time of network design.

As described above, according to the present embodiment, the failure prediction section 180: inputs a value of a current that flows through the laser diode and is measured at predetermined time intervals, stores the inputted current value in a paired manner with the measurement time of day, detects a current value that is the current value at any one of stored measurement times of day and that has a change greater than or equal to a predetermined value relative to the current value at the preceding measurement time of day, and generates a prediction curve that indicates the relationship between the elapsed time and the current value applicable at and after the measurement time of day of the detected current value on the basis of the detected current value and the change information concerning the current value corresponding to the elapsed time from the beginning of usage of the laser diode.

By virtue of this, the failure prediction section 180 can perform automatic current prediction until the value of the current that flows through the laser diode reaches the overcurrent limit value that indicates the limit value of a current that the laser diode can bear. This permits prediction of a failure time point of the laser diode.

Further, the failure prediction section 180 stores difference information composed of a pair of the difference between the detected current value and the current value at the preceding measurement time of day and the elapsed time until the measurement time of day of the detected current value; judges whether the difference between the detected current value and a current value corresponding to the measurement time of day of the current value on an already generated prediction curve is greater than or equal to a predetermined value; judges whether the number of difference information pieces stored in the difference information storage section 540 is greater than or equal to a predetermined number when the difference is judged as being greater than or equal to the predetermined value; corrects the prediction curve on the basis of the difference information in the difference information storage section 540 when the number of difference information pieces is judged as being greater than or equal to the predetermined number; and corrects the prediction curve on the basis of the characteristics information in the characteristics information storage section 550 when the number of difference information pieces is judged as being smaller than the predetermined number.

By virtue of this, the failure prediction section 180 corrects the prediction curve such as to correct the prediction curve in accordance with the present environment around the laser diode and its degradation, and thereby can accurately predict a failure time point of the laser diode.

As described above, the failure prediction apparatus, the failure prediction method, and the failure prediction program has an effect that failure prediction for a laser diode employed in an optical transmission apparatus is achieved automatically and accurately.

As described above, the failure prediction apparatus, the failure prediction method, and the failure prediction program according to the present invention is useful in failure prediction for a laser diode and, in particular, suitable for an optical transmission apparatus employing a laser diode.

The turn of the embodiments isn't a showing the superiority and inferiority of the invention. Although the embodiments of the present inventions have been described in detail, it should be understood that the various changes, substitutions, and alterations could be made hereto without depending from the sprit and scope of the invention.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A failure prediction apparatus for predicting a failure of a laser diode, comprising:
   an input configured to input a value of a current that flows through the laser diode and is measured at predetermined time intervals;
   a storage configured to store the current values inputted by said input, each of the current values being stored in a paired manner with a measurement time of day;
   a detector configured to detect a current value that is a current value at any one of the measurement times of day stored in said storage and that has a change greater than or equal to a predetermined value relative to the current value at the preceding measurement time of day; and
   a generator configured to generate a prediction curve, the prediction curve indicating a relationship between said elapsed time and the current value applicable at and after the measurement time of day of the current value detected by said detector on the basis of the current value detected by said detector and change information concerning a current value corresponding to an elapsed time from beginning of usage of the laser diode,
   wherein said generator generates a prediction curve on the basis of: the current value detected by said detector; and characteristics information that is characteristics information defined in advance on the basis of component characteristics of the laser diode and that indicates a change in the current value corresponding to said elapsed time until a failure of the laser diode,
   wherein said generator comprises:
   a difference information storage storing difference information comprise of a pair of a difference between the current value detected by said detector and the current value at the preceding measurement time of day and said elapsed time until the measurement time of day of the current value detected by said detector;

a curve judge judging whether a difference between the current value detected by said detector and a current value corresponding to the measurement time of day of the current value on an already generated prediction curve is greater than or equal to a predetermined value;

a number-of-information-pieces judge judging whether the number of difference information pieces stored in said difference information storage is greater than or equal to a predetermined value when said curve judge judges that the difference is greater than or equal to the predetermined value; and a prediction curve corrector correcting said prediction curve on the basis of the difference information in said difference information storage when said number-of-information-pieces judge judges that the number of difference information pieces is greater than or equal to the predetermined number, and correcting said prediction curve on the basis of said characteristics information when said number-of-information-pieces judge judges that the number of difference information pieces is smaller than the predetermined number.

2. The failure prediction apparatus according to claim 1, wherein when the elapsed time until the measurement time of day of the current value detected by said detector is shorter than the time indicated in said characteristics information in correspondence to the current value, said generator generates a prediction curve on the basis of said characteristics information and said elapsed time.

3. A failure prediction method for predicting a failure of a laser diode, comprising:

inputting a value of a current that flows through the laser diode and is measured at predetermined time intervals;

storing the current values inputted by said inputting, each in a paired manner with a measurement time of day;

detecting a current value that is a current value at any one of the measurement times of day stored in said storing and that has a change greater than or equal to a predetermined value relative to the current value at the preceding measurement time of day; and generating a prediction curve that indicates a relationship between said elapsed time and the current value applicable at and after the measurement time of day of the current value detected by said detecting on the basis of the current value detected by said detecting and change information concerning a current value corresponding to an elapsed time from beginning of usage of the laser diode, wherein said generating generates a prediction curve on the basis of the current value detected by said detecting, and characteristics information that is characteristics information defined in advance on the basis of component characteristics of the laser diode and that indicates a change in the current value corresponding to said elapsed time until a failure of the laser diode, wherein said generating comprises:

storing difference information composed of a pair of a difference between the current value detected by said detecting and the current value at the preceding measurement time of day and said elapsed time until the measurement time of day of the current value detected by said detecting;

judging whether a difference between the current value detected by said detecting and a current value corresponding to the measurement time of day of the current value on an already generated prediction curve is greater than or equal to a predetermined value;

judging whether the number of difference information pieces stored in said difference information storage is greater than or equal to a predetermined value when said curve judging operation judges that the difference is greater than or equal to the predetermined value; and correcting said prediction curve on the basis of the difference information in said difference information storage when said number-of-information-pieces judging judges that the number of difference information pieces is greater than or equal to the predetermined number, and correcting said prediction curve on the basis of said characteristics information when said number-of-information-pieces judging judges that the number of difference information pieces is smaller than the predetermined number.

4. The failure prediction method according to claim 3, wherein generating operation a prediction curve on the basis of said characteristics information and said elapsed time when the elapsed time until the measurement time of day of the current value detected by said detecting is shorter than the time indicated in said characteristics information in correspondence to the current value.

* * * * *